United States Patent
Belhachemi et al.

(10) Patent No.: US 11,870,411 B2
(45) Date of Patent: Jan. 9, 2024

(54) METHOD FOR MANUFACTURING A SUBSTRATE FOR A RADIOFREQUENCY DEVICE

(71) Applicant: Soitec, Bernin (FR)

(72) Inventors: Djamel Belhachemi, Saint Martin D'Heres (FR); Thierry Barge, Chevrieres (FR)

(73) Assignee: SOITEC, Bernin (FR)

( * ) Notice: Subject to any disclaimer, the term of this patent is extended or adjusted under 35 U.S.C. 154(b) by 710 days.

(21) Appl. No.: 17/041,367

(22) PCT Filed: Mar. 26, 2019

(86) PCT No.: PCT/FR2019/050685
§ 371 (c)(1),
(2) Date: Sep. 24, 2020

(87) PCT Pub. No.: WO2019/186053
PCT Pub. Date: Oct. 3, 2019

(65) Prior Publication Data
US 2021/0075389 A1    Mar. 11, 2021

(30) Foreign Application Priority Data

Mar. 26, 2018 (FR) ........................ 1852574

(51) Int. Cl.
*H10N 30/08* (2023.01)
*H03H 3/10* (2006.01)
(Continued)

(52) U.S. Cl.
CPC .................. *H03H 3/10* (2013.01); *C09J 7/30* (2018.01); *H03H 9/02574* (2013.01);
(Continued)

(58) Field of Classification Search
None
See application file for complete search history.

(56) References Cited

U.S. PATENT DOCUMENTS 7,982,296 B2 * 7/2011 Nuzzo ..................... H01L 24/03
257/466
8,865,489 B2 * 10/2014 Rogers ................ H01L 25/0753
438/459
(Continued)

FOREIGN PATENT DOCUMENTS

FR    3045678 B1    12/2017
FR    3053532 B1    11/2018
(Continued)

OTHER PUBLICATIONS

French Written Opinion for French Application No. 19719549.8 dated May 23, 2023, 6 pages.
(Continued)

*Primary Examiner* — Michael Lebentritt
(74) *Attorney, Agent, or Firm* — TraskBritt (57) ABSTRACT

A process for fabricating a substrate for a radiofrequency device by joining a piezoelectric layer to a carrier substrate by way of an electrically insulating layer, the piezoelectric layer having a rough surface at its interface with the electrically insulating layer, the process being characterized in that it comprises the following steps: —providing a piezoelectric substrate having a rough surface for reflecting a radiofrequency wave, —depositing a dielectric layer on the rough surface of the piezoelectric substrate, —providing a carrier substrate, —depositing a photo-polymerizable adhesive layer on the carrier substrate, —bonding the piezoelectric substrate to the carrier substrate by way of the dielectric layer and of the adhesive layer, in order to form an assembled substrate, —irradiating the assembled substrate with a light flux in order to polymerize the adhesive layer, (Continued)

the adhesive layer and the dielectric layer together forming the electrically insulating layer.

19 Claims, 3 Drawing Sheets

(51) Int. Cl.
  *C09J 7/30* (2018.01)
  *H03H 9/02* (2006.01)
  *H03H 9/25* (2006.01)
  *H03H 9/64* (2006.01)
  *H10N 30/073* (2023.01)
  *H10N 30/082* (2023.01)
  *H10N 30/086* (2023.01)

(52) U.S. Cl.
  CPC .... *H03H 9/02834* (2013.01); *H03H 9/02897* (2013.01); *H03H 9/25* (2013.01); *H03H 9/6489* (2013.01); *H10N 30/073* (2023.02); *H10N 30/08* (2023.02); *H10N 30/082* (2023.02); *H10N 30/086* (2023.02)

(56) References Cited

U.S. PATENT DOCUMENTS

| | | | |
|---|---|---|---|
| 8,886,334 B2* | 11/2014 | Ghaffari | A61B 5/145 607/115 |
| 2006/0076584 A1 | 4/2006 | Kim et al. | |
| 2012/0086312 A1 | 4/2012 | Kobayashi et al. | |
| 2019/0006577 A1 | 1/2019 | Ghyselen et al. | |
| 2019/0372552 A1 | 12/2019 | Gaudin et al. | |

FOREIGN PATENT DOCUMENTS

| | | | |
|---|---|---|---|
| JP | 11-017490 A | 1/1999 | |
| JP | 2001-053579 A | 2/2001 | |
| JP | 2002-223138 A | 8/2002 | |
| JP | 2005-011393 A | 1/2005 | |
| JP | 2005-229455 A | 8/2005 | |
| JP | 2012-005106 A | 1/2012 | |
| JP | 2012-085286 A | 4/2012 | |
| JP | 2012-199762 | 10/2012 | |
| JP | 2013-212324 A | 10/2013 | |
| JP | 5961863 | 8/2016 | |
| JP | 2017-204729 A | 11/2017 | |
| JP | 6250856 B1 | 12/2017 | |
| JP | 2018-014606 A | 1/2018 | |
| WO | WO-2013031617 A1 * | 3/2013 | ......... H01L 41/0815 |

OTHER PUBLICATIONS

Japanese Office Action for Application No. 2020-551935 dated Mar. 7, 2023, 7 pages.
International Search Report for International Application No. PCT/ 2019/050685 dated May 22, 2020.
International Written Opinion for International Application No. PCT/2019/050685 dated May 22, 2020, 5 pages.
Singapore Written Opinion for Singapore Application No. 11202009404S dated Sep. 23, 2021, 7 pages.
Japanese Office Action for Application No. 2020-551935 dated Sep. 19, 2023, 7 pages.

* cited by examiner

METHOD FOR MANUFACTURING A SUBSTRATE FOR A RADIOFREQUENCY DEVICE

CROSS-REFERENCE TO RELATED APPLICATIONS

This application is a national phase entry under 35 U.S.C. § 371 of International Patent Application PCT/FR2019/050685, filed Mar. 26, 2019, designating the United States of America and published as International Patent Publication WO 2019/186053 A1 on Oct. 3, 2019, which claims the benefit under Article 8 of the Patent Cooperation Treaty to French Patent Application Serial No. 1852574, filed Mar. 26, 2018.

TECHNICAL FIELD

The present disclosure relates to a process for fabricating a substrate for a radiofrequency device.

BACKGROUND

It is known practice to produce a radiofrequency (RF) device, such as a resonator or filter, on a substrate comprising, successively, from its base to its surface, a carrier substrate, generally made of a semiconductor material such as silicon, an electrically insulating layer and a piezoelectric layer.

Surface-acoustic-wave (SAW) filters typically comprise a thick piezoelectric layer (i.e., with a thickness generally of several tens of μm) and two electrodes in the form of two interdigitated metal combs deposited on the surface of the piezoelectric layer. An electrical signal, typically a voltage variation, applied to an electrode is converted into an elastic wave, which propagates at the surface of the piezoelectric layer. The propagation of this elastic wave is promoted if the frequency of the wave corresponds to the frequency band of the filter. This wave is converted into an electrical signal again when it reaches the other electrode.

However, there are parasitic modes of propagation of the wave, which extend into the thickness of the piezoelectric layer and are susceptible to reflection at the interface with the carrier substrate beneath. This effect is called "rattle."

To avoid these parasitic modes, it is known practice to make the surface of the piezoelectric layer located at the interface with the electrically insulating layer rough enough to allow the parasitic waves to be reflected in all directions (scatter effect) and prevent their transmission into the substrate.

Given the wavelength in question, the roughness of the surface of the piezoelectric layer is very high, of the order of a few μm.

Producing the substrate entails bonding the rough surface of the piezoelectric layer, which is optionally covered with the electrically insulating layer, to the carrier substrate.

However, to ensure a good adhesion between the piezoelectric layer and the carrier substrate despite such roughness, the current process requires a large number of successive steps, which makes it lengthy and expensive.

Thus, a process could include the following steps:
depositing a layer of silicon oxide ($SiO_2$), by plasma-enhanced chemical vapor deposition (PECVD), on the rough surface of the piezoelectric layer, to a thickness of about 2 μm,
depositing a first layer of $SiO_2$ on the surface of the piezoelectric layer opposite the rough surface, to a thickness of about 0.5 μm,
carrying out a first chemical-mechanical polish (CMP) of the $SiO_2$ layer deposited on the rough surface; however, the roughness obtained following this polish remains too high for a good quality bond,
depositing a second layer of $SiO_2$ on the surface of the piezoelectric layer opposite the rough surface, to a thickness of about 0.5 μm,
carrying out a second chemical mechanical polish (CMP) of the $SiO_2$ layer deposited on the rough surface, until a sufficient roughness to allow bonding of good quality of the piezoelectric layer covered with the $SiO_2$ layer to the carrier substrate is obtained, the carrier substrate itself being covered with an $SiO_2$ layer requiring mechanical-chemical polishing (CMP).

Apart from the cost induced by the implementation of the aforementioned steps on the carrier substrate and on the piezoelectric layer, this process has the drawback of generating a significant curvature or bow of the substrate, this bow being due to the fact that the deposition of the $SiO_2$ layers on the piezoelectric substrate is carried out at high temperature. This bow disrupts the operations subsequently carried out on the substrate to fabricate the filter, which are meant to be carried out on flat substrates.

BRIEF SUMMARY

One aim of the present disclosure is to remedy the aforementioned drawbacks and, in particular, to provide a process for fabricating a substrate for a radiofrequency device having a lower cost and/or a lower bow compared to the prior-art process.

To this end, the present disclosure provides a process for fabricating a substrate for a radiofrequency device by joining a piezoelectric layer to a carrier substrate by way of an electrically insulating layer, the piezoelectric layer having a rough surface at its interface with the electrically insulating layer, wherein the process comprises:
providing a piezoelectric substrate having a rough surface suitable for reflecting a radiofrequency wave,
depositing a dielectric layer on the rough surface of the piezoelectric substrate,
providing a carrier substrate,
depositing a photo-polymerizable adhesive layer on the carrier substrate,
bonding the piezoelectric substrate to the carrier substrate by way of the dielectric layer and of the adhesive layer, in order to form an assembled substrate,
irradiating the assembled substrate with a light flux in order to polymerize the adhesive layer, the adhesive layer and the dielectric layer together forming the electrically insulating layer.

By "rough surface" what is meant in the present text is a surface the roughness of which is of the same order of magnitude as the wavelength of the RF waves intended to propagate through the piezoelectric layer of the filter, so as to allow the reflection of parasite waves from the surface. In the context of the present disclosure, the roughness of such a surface is between 0.3 and 5 μm RMS, and preferably between 1.5 and 2.2 μm RMS.

A radiofrequency device may include one or more resonators or filters. For a given frequency f of use, those skilled in the art will be able to choose the characteristics of the piezoelectric layer and, in particular, the material from which it is made. The choice of material and its cut has an influence, for a wavelength λ of the RF wave in question, on the propagation speed υ of the wave, given that the speed v is related to the frequency f and to the wavelength λ by the following relation (1):

$$f = \frac{\upsilon}{\lambda} \quad (1)$$

In addition, the frequency f is related to the geometry p of the electrodes of the device (which generally take the form of interdigitated metal combs deposited on the surface of the piezoelectric layer, p then being the periodic distance between the combs) by inserting the following relationship (2) into relationship (1):

$$\lambda = 2*p \quad (2)$$

Therefore, depending on the working frequency in question, it is possible for a person skilled in the art to adjust the strength of the electromechanical coupling of the device via the geometry p of the interdigitated combs, and the propagation speed υ of the wave via the characteristics of the material of the piezoelectric layer.

The implementation of bonding the adhesive layer and the dielectric layer makes it possible to dispense with the steps required to form a sufficiently smooth $SiO_2$ layer on the rough surface, and to avoid the need for high-temperature depositions capable of causing significant bowing of the substrate. Moreover, the dielectric layer in contact with the piezoelectric layer allows a good acoustic performance to be achieved with the substrate.

According to other aspects, the proposed process has the following various features, which may be implemented alone or in technically feasible combinations thereof:
- the dielectric layer comprises a layer of silicon oxide, a layer of silicon nitride, a layer comprising a combination of silicon nitride and oxide, and/or a superposition of at least a layer of silicon oxide and of a layer of silicon nitride that is deposited on the piezoelectric substrate by plasma-enhanced chemical vapor deposition;
- the dielectric layer is a glass layer deposited by spin-coating on the piezoelectric substrate;
- the thickness of the photo-polymerizable adhesive layer is between 2 µm and 8 µm;
- the photo-polymerizable adhesive layer is deposited by spin-coating;
- the bonding step is carried out at a temperature between 20 and 50° C., and preferably between 20° C. and 30° C.;
- the light flux is applied through the piezoelectric substrate;
- irradiation is pulsed;
- the light flux has a wavelength between 320 nm and 365 nm;
- the carrier substrate is made of a material possessing a coefficient of thermal expansion lower than that of the material from which the piezoelectric substrate is made;
- the carrier substrate is made of silicon, of sapphire, of polycrystalline aluminum nitride (AlN), or of gallium arsenide (GaAs);
- the process furthermore comprises, after the polymerization of the adhesive layer, a step of thinning the piezoelectric substrate so as to transfer, to the carrier substrate, a piezoelectric layer of a defined thickness;
- the thinning step comprises etching and/or chemical-mechanical polishing;
- the process comprises, after the thinning step, carrying out an anneal to smooth the piezoelectric layer;
- each step subsequent to the bonding is carried out at a temperature lower than or equal to 300° C.;

Another subject of the present disclosure relates to a process for fabricating a radiofrequency filter, comprising:
- fabricating a substrate using the fabrication process as described herein, and
- forming a pair of interdigitated electrodes on the surface of the piezoelectric layer of the substrate.

The present disclosure also relates to a radiofrequency-device substrate capable of being obtained using the process described herein, comprising, in succession, a carrier substrate, an electrically insulating layer and a piezoelectric layer having, at its interface with the electrically insulating layer, a rough surface suitable for reflecting a radiofrequency wave, the electrically insulating layer comprising, in succession, from the carrier substrate to the piezoelectric layer, a polymerized adhesive layer and a dielectric layer.

Another subject of the present disclosure is a radiofrequency filter, comprising a substrate such as described above and a pair of interdigitated electrodes extending over the surface of the piezoelectric layer.

BRIEF DESCRIPTION OF THE DRAWINGS

Other features and advantages of the present disclosure will emerge from the detailed description that follows, with reference to the appended drawings, in which.

For the sake of legibility of the figures, the illustrated elements are not necessarily shown to scale. Moreover, elements designated by the same reference signs in the various figures are identical or perform the same function.

DETAILED DESCRIPTION

A first subject of the present disclosure relates to a process for fabricating a radiofrequency-device substrate, called the final substrate, by joining by bonding a piezoelectric layer to a carrier substrate.

The carrier substrate 1 is made of a material possessing a coefficient of thermal expansion lower than that of the material from which the piezoelectric substrate 3 is made. Thus, the carrier substrate plays the role of a stiffener that limits the expansion of the piezoelectric substrate during temperature variations to which it is subjected, this making it possible to decrease the thermal frequency coefficient of the piezoelectric substrate, i.e., the extent to which the frequency of a wave propagating through the piezoelectric substrate varies with temperature. Suitable materials are, for example, silicon, sapphire, polycrystalline aluminum nitride (AlN), or indeed gallium arsenide (GaAs). Silicon is particularly preferred because it allows the process to be performed on microelectronic production lines that are set up for silicon.

In the present disclosure, it is the coefficient of thermal expansion in a plane parallel to the main surface of the substrates that is of interest.

Figure 1:
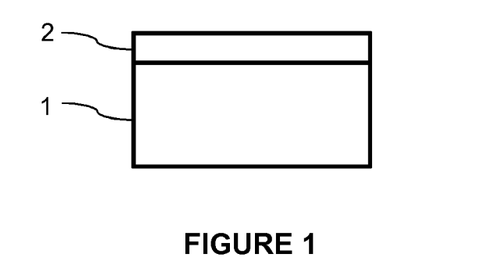
FIG. 1 schematically illustrates the step of depositing the photo-polymerizable adhesive layer on the carrier substrate.

In a first step, which is shown in FIG. 1, a photo-polymerizable adhesive layer 2 is deposited on an exposed face of the carrier substrate 1.

The photo-polymerizable adhesive layer is advantageously deposited by spin-coating. This technique consists in rotating the substrate on which the photo-polymerizable layer is to be deposited about itself at a substantially constant and relatively high speed in order to spread the photo-polymerizable layer uniformly over the entire surface of the substrate by centrifugal force. To this end, the substrate is typically placed and held by vacuum chuck on a turntable.

A person skilled in the art is capable of determining the operating conditions, such as the volume of adhesive deposited on the surface of the substrate, the speed of rotation of the substrate, and the minimum deposition time according to the desired thickness for the adhesive layer.

The thickness of the photo-polymerizable adhesive layer 2 is typically between 2 μm (microns) and 8 μm.

According to one nonlimiting example, the photo-polymerizable adhesive layer sold under the reference "NOA 61" by NORLAND PRODUCTS can be used in the present disclosure.

Figure 2:
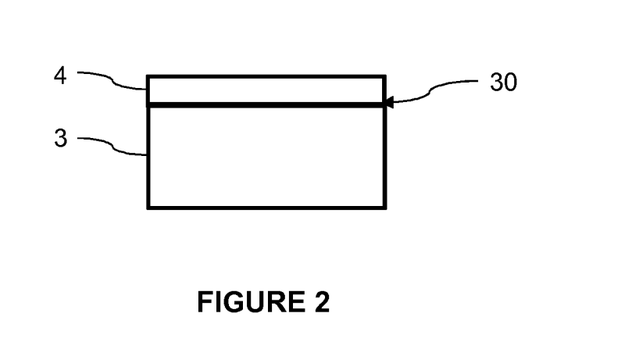
FIG. 2 schematically illustrates the step of depositing the dielectric layer on the piezoelectric substrate.

In a second step, a dielectric layer 4 is formed on a rough surface 30 of the piezoelectric substrate 3. FIG. 2 shows the piezoelectric substrate 3 on which a dielectric layer 4 has been deposited. It will be understood that this second step can be carried out prior to, in parallel with, or subsequently to the first step of depositing the photo-polymerizable adhesive layer.

According to one embodiment, the dielectric layer 4 is a layer of silicon oxide, or a layer of silicon nitride, or a layer comprising a combination of silicon nitride and oxide, or a superposition of at least a layer of silicon oxide and of a layer of silicon nitride. For example, a layer of silicon oxide $SiO_2$, or a layer of nitride $Si_3N_4$, a layer comprising a combination of nitride and oxide SiOxNy, or a superposition of a layer of oxide $SiO_2$ and of a layer of nitride $Si_3N_4$ will possibly be formed. Specifically, these materials are conventionally used in radiofrequency devices, in particular, in the form of an $Si_2/Si_3N_4$ stack, to guide surface acoustic waves. The one or more layers of silicon oxide and/or nitride are preferably deposited by plasma-enhanced chemical vapor deposition (PECVD).

According to one preferred embodiment, the dielectric layer 4 is a glass layer deposited by spin-coating on the piezoelectric substrate (i.e., it is a layer of so-called "spin-on glass" (SOG)). This technique is advantageous in that the deposition of the layer is carried out at room temperature and followed by a densifying anneal at a temperature of around 250° C., and therefore it does not cause the substrate on which the dielectric layer is formed to deform.

A dielectric layer made of oxide or SOG allows the acoustic performance of a radiofrequency device subsequently obtained from the piezoelectric substrate to be kept at an optimal level.

Such an oxide or SOG dielectric layer that has a smoothing effect, i.e., a layer the free surface of which does not conform to the rough surface of the piezoelectric substrate, but remains substantially smooth or at the very least has a much lower roughness than that of the piezoelectric substrate, will preferably be chosen. Thus, the free surface of the dielectric layer is sufficiently smooth to allow good quality bonding to the carrier substrate.

Figure 3:
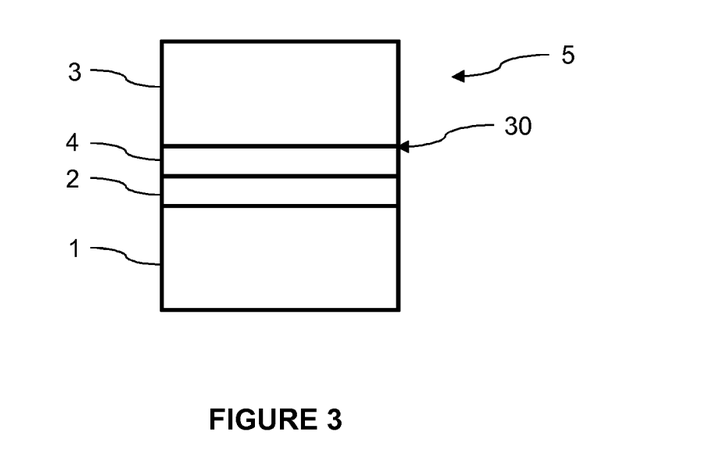
FIG. 3 schematically illustrates an assembled substrate obtained by bonding the carrier substrate to the piezoelectric substrate, with the adhesive layer and dielectric layer located at the bonding interface.

The piezoelectric substrate 3 is then bonded to the carrier substrate 1 by way of the dielectric layer 4 and of the adhesive layer 2, in order to form an assembled substrate 5, one embodiment of which is shown in FIG. 3.

The assembled substrate 5 is thus formed by the superposition of the carrier substrate 1, of the adhesive layer 2, of the dielectric layer 4, and of the piezoelectric substrate 3, the adhesive layer 2 and the dielectric layer 4 being located at the interface between the carrier substrate 1 and piezoelectric substrate 3. The rough surface 30 of the piezoelectric layer 3 is thus located at the interface between the piezoelectric layer 3 and the dielectric layer 4, and is suitable for reflecting a radiofrequency wave travelling through the piezoelectric layer.

The bonding is preferably carried out at room temperature, i.e., at about 20° C. It is, however, possible to carry out the bonding at a temperature between 20° C. and 50° C., and more preferably between 20° C. and 30° C.

In addition, the bonding step is advantageously carried out at low pressure, i.e., at a pressure lower than or equal to 5 mTorr, this allowing water to be desorbed from the surfaces forming the bonding interface, i.e., the surface of the adhesive layer and the rough surface of the piezoelectric substrate. Carrying out the bonding step under vacuum allows the desorption of water at the bonding interface to be further improved.

The use of the polymer layer 2 as a bonding layer on the one hand allows the piezoelectric substrate 3 to be effectively bonded to the carrier substrate 1, in particular, as the surface 30 of the piezoelectric substrate is rough (it is widely accepted that a polymer adheres more easily to a slightly rough surface). On the other hand, the deposition of the adhesive layer 2, the assembly of the substrates 1 and 3, and the irradiation of the assembled substrate 5 are carried out more quickly and simply than in prior-art techniques, in which techniques the successive depositions of $SiO_2$ layers on the rough surface and on the surface opposite the rough surface of the piezoelectric layer are time-consuming and tedious to implement.

In addition, the proposed process has a greatly decreased cost, since the deposition and UV irradiation of the adhesive layer are much less expensive than the successive depositions of $SiO_2$, and do not require mechanical-chemical polishing (CMP) to be carried out.

Bonding using a polymer layer as proposed also allows another major problem that arises during the successive depositions of the $SiO_2$ layers, namely the creation of a substantial unwanted bow in the substrate, which hinders the fabrication of radiofrequency devices from the substrate, to be solved by avoiding such deposits of $SiO_2$. The process of the present disclosure thus allows deformation of the piezoelectric substrate and of the carrier substrate during the deposition of the dielectric layer and of the adhesive layer, respectively, and of the final substrate obtained after bonding and irradiation, to be avoided or at the very least decreased.

Figure 4:
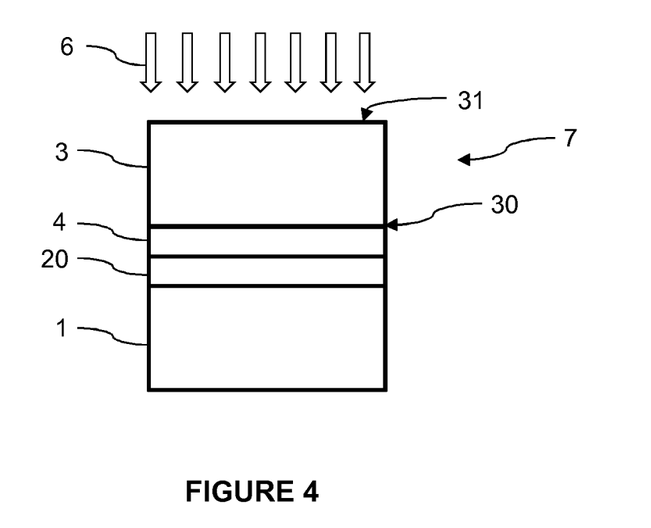
FIG. 4 schematically illustrates the step of polymerizing the adhesive layer after bonding of the piezoelectric substrate to the carrier substrate, so as to form a radiofrequency-device substrate according to the present disclosure.

The assembled substrate 5 is then subjected to irradiation with a light flux 6, in order to polymerize the adhesive layer 2. The irradiation of the assembled substrate 5 is shown in FIG. 4.

The light source is preferably a laser.

The substrate 5, or light flux, is preferably ultra-violet (UV) radiation. Depending on the composition of the adhesive layer 2, UV radiation having a wavelength of between 320 nm (nanometers) and 365 nm will preferably be chosen.

The irradiation is carried out by exposing the surface 31 of the piezoelectric substrate to the light flux 6. Thus, the light radiation penetrates into the assembled substrate 5 from the surface 31 of the piezoelectric substrate 3, passes through the piezoelectric substrate, passes through the dielectric layer 4, and then reaches the adhesive layer 2, thus causing the polymerization of the adhesive layer.

The polymerization of the adhesive layer 20 results in a polymer layer that ensures the mechanical cohesion of the assembled substrate by keeping the carrier substrate 1 and the piezoelectric substrate 3, which together form the final substrate 7, bonded together.

The irradiation of the assembled substrate 5 gives rise to a thermal process via which the piezoelectric layer 3, through which the radiation passes, is able to partially absorb the energy of the radiation and to heat up. Too much heating could destabilize the structure of the piezoelectric layer, which could lead to a degradation of the physical and chemical properties of the piezoelectric layer. Furthermore, too much heating could cause deformation of the piezoelectric layer and of the carrier substrate as a result of their difference in thermal expansion coefficient, resulting in an overall deformation (bow) of the assembled substrate and therefore of the resulting final substrate.

In order to avoid excessive heating of the piezoelectric layer 3, the irradiation is advantageously pulsed, i.e., the assembled substrate is exposed to a plurality of pulses of light rays. Each pulse lasts a set irradiation time, which may be equal to or different from one pulse to the next. The pulses are spaced apart in time by a set rest time during which the assembled substrate is not exposed to light rays.

Those skilled in the art will be able to set the irradiation time of each pulse, the rest time between each pulse, and the number of pulses to be applied to completely polymerize the adhesive layer.

Thus, for example, about ten pulses lasting 10 seconds each, separated by rest times also lasting 10 seconds each, will possibly be employed.

After irradiation, a final substrate consisting of the substrate assembled with a polymerized adhesive layer is obtained.

The thickness of the polymerized adhesive layer 20 is preferably between 2 μm (microns) and 8 μm. This thickness, in particular, depends on the material from which the photo-polymerizable adhesive layer deposited before bonding is made, on the thickness of the photo-polymerizable adhesive layer, and on the experimental irradiation conditions.

Figure 5:
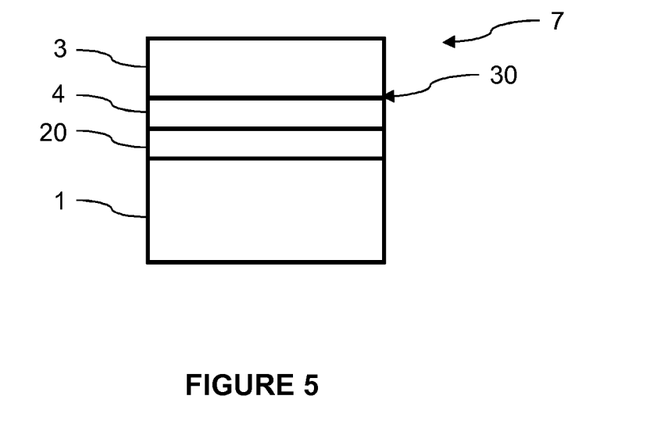
FIG. 5 is a cross-sectional view of the radiofrequency-device substrate after thinning of the piezoelectric substrate.

Optionally, after polymerization of the adhesive layer, the piezoelectric substrate 3 is thinned by removing material from the exposed surface 31. This thinning step allows the thickness of the piezoelectric layer to be decreased and thus, on the carrier substrate 1, a piezoelectric layer 3 of a determined thickness to be obtained. The final substrate 7 having a thinned piezoelectric layer 3 is shown in FIG. 5. The thinning step may, in particular, be carried out by etching and/or by chemical-mechanical polishing the piezoelectric layer.

After thinning, an anneal is preferably carried out to smooth the thinned piezoelectric layer. The smoothing involves a surface treatment aiming to make the exposed surface of the piezoelectric layer flat and to decrease the roughness thereof.

The steps of the process that are subsequent to the bonding of the piezoelectric substrate 3 on the carrier substrate 1 are carried out at a temperature lower than or equal to 300° C., so as not to degrade their structure, in particular, the structure of the adhesive layer 2, 20, or cause deformation of the substrates.

A second subject of the present disclosure is a process for fabricating a radiofrequency device, such as a resonator or a filter, from a final substrate obtained by implementing the fabrication process described above according to the first subject of the present disclosure, and a radiofrequency device. Specifically, the fabrication of such a radiofrequency device is possible at a temperature not exceeding 300° C.

Among the producible radiofrequency devices, the described process lends itself most particularly to the fabrication of a surface-acoustic-wave filter. In the latter case, it is first of all a question of fabricating the final substrate using the preceding process, then of forming a pair of interdigitated electrodes on the surface of the piezoelectric layer of the final substrate.

Figure 6:
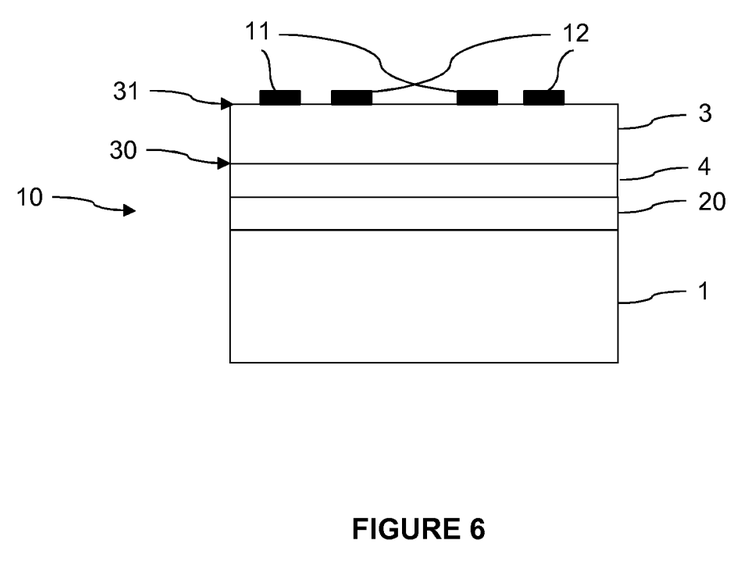
FIG. 6 is a schematic illustration of a surface-acoustic-wave filter according to one embodiment of the present disclosure.

FIG. 6 is a schematic illustration of a surface-acoustic-wave filter 10 according to one embodiment, fabricated using a final substrate 7 such as described above. The filter comprises a piezoelectric layer 3 and two electrodes 11, 12 taking the form of two interdigitated metal combs deposited on the surface 31 of the piezoelectric layer. On the side opposite to the electrodes, the piezoelectric layer 3 rests, via its rough surface 30, on a dielectric layer 4, a polymerized adhesive layer 20, and a carrier substrate 1. The piezoelectric layer 3 is single-crystal as an excellent crystalline quality is required to not generate an attenuation of the surface wave.

Compared to bonding using a polymerized adhesive layer of the piezoelectric layer and the carrier substrate, the performance of such a surface-acoustic-wave filter is improved because the dielectric layer on the piezoelectric layer has an interface that is rough and that provides a contrast in acoustic impedance. A polymerized adhesive layer making contact with the piezoelectric layer would have non-negligible adverse influences on performance.

The invention claimed is:

1. A process for fabricating a substrate for a radiofrequency device by joining a piezoelectric layer to a carrier substrate by way of an electrically insulating layer, the piezoelectric layer having a rough surface at its interface with the electrically insulating layer, the process comprises:
    providing a piezoelectric substrate having a rough surface suitable for reflecting a radiofrequency wave;
    depositing a dielectric layer on the rough surface of the piezoelectric substrate;
    providing a carrier substrate;
    depositing a photo-polymerizable adhesive layer on the carrier substrate;
    bonding the piezoelectric substrate to the carrier substrate by way of the dielectric layer and of the adhesive layer, in order to form an assembled substrate;
    irradiating the assembled substrate with a light flux in order to polymerize the adhesive layer, the adhesive layer and the dielectric layer together forming the electrically insulating layer.

2. The process of claim 1, wherein the dielectric layer comprises a layer of silicon oxide, a layer of silicon nitride, a layer comprising a combination of silicon nitride and oxide, and/or a superposition of at least a layer of silicon oxide and of a layer of silicon nitride that is deposited on the piezoelectric substrate by plasma-enhanced chemical vapor deposition.

3. The process of claim 1, wherein the dielectric layer is a glass layer deposited by spin-coating on the piezoelectric substrate.

4. The process of claim 1, wherein a thickness of the photo-polymerizable adhesive layer is between 2 μm and 8 μm.

5. The process of claim 1, wherein the photo-polymerizable adhesive layer is deposited by spin-coating.

6. The process of claim 1, wherein the bonding of the piezoelectric substrate to the carrier substrate is carried out at a temperature between 20 and 50° C.

7. The process of claim 1, wherein the light flux is applied through the piezoelectric substrate.

8. The process if claim 1, wherein the light flux is pulsed.

9. The process of claim 1, wherein the light flux has a wavelength comprised between 320 nm and 365 nm.

10. The process of claim 1, wherein the carrier substrate comprises a material possessing a coefficient of thermal expansion lower than a coefficient of thermal expansion of a material of the piezoelectric substrate.

11. The process of claim 1, wherein the carrier substrate comprises at least one material selected from among the group consisting of silicon, sapphire, polycrystalline aluminum nitride (AlN), and gallium arsenide (GaAs).

12. The process of claim 1, furthermore comprising, after the polymerization of the adhesive layer, thinning the piezoelectric substrate so as to transfer, to the carrier substrate, a piezoelectric layer of a defined thickness.

13. The process of claim 12, wherein the thinning step comprises etching and/or chemical-mechanical polishing.

14. The process as claimed in either of claims 12 and 13 of claim 12, further comprising, after the thinning of the piezoelectric substrate, carrying out an anneal to smooth the piezoelectric layer.

15. The process of claim 1, wherein each step subsequent to the bonding is carried out at a temperature lower than or equal to 300° C.

16. A process for fabricating a radiofrequency filter, comprising:
fabricating a substrate using the process of claim 1; and
forming a pair of interdigitated electrodes on the surface of the piezoelectric layer of the substrate.

17. A radiofrequency-device substrate, comprising, in succession, a carrier substrate, an electrically insulating layer and a piezoelectric layer having, at its interface with the electrically insulating layer, a rough surface suitable for reflecting a radiofrequency wave, the electrically insulating layer comprising, in succession, from the carrier substrate to the piezoelectric layer, a polymerized adhesive layer and a dielectric layer.

18. A radiofrequency filter comprising a radiofrequency-device substrate according to claim 17, and a pair of interdigitated electrodes extending over a surface of the piezoelectric layer.

19. The process of claim 6, wherein the bonding of the piezoelectric substrate to the carrier substrate is carried out at a temperature between 20° C. and 30° C.

* * * * *

UNITED STATES PATENT AND TRADEMARK OFFICE
CERTIFICATE OF CORRECTION

| | |
|---|---|
| PATENT NO. | : 11,870,411 B2 |
| APPLICATION NO. | : 17/041367 |
| DATED | : January 9, 2024 |
| INVENTOR(S) | : Djamel Belhachemi and Thierry Barge |

It is certified that error appears in the above-identified patent and that said Letters Patent is hereby corrected as shown below:

In the Specification

Column 5, Line 52, change "an $Si_2/Si_3N_4$ stack," to --an $SiO_2/Si_3N_4$ stack,--

In the Claims

Claim 14, Column 10, Line 3, change "process as claimed in either of claims 12 and 13 of claim 12, further comprising," to --process of claim 12, further comprising,--

Signed and Sealed this
Fifth Day of March, 2024

Katherine Kelly Vidal
*Director of the United States Patent and Trademark Office*